United States Patent [19]

Yen

[11] 4,084,869
[45] Apr. 18, 1978

[54] INTERCONNECTOR FOR INTEGRATED CIRCUIT PACKAGE

[75] Inventor: Yao T. Yen, Cupertino, Calif.

[73] Assignee: Intel Corporation, Santa Clara, Calif.

[21] Appl. No.: 740,390

[22] Filed: Nov. 10, 1976

[51] Int. Cl.² .............................................. H05K 1/12
[52] U.S. Cl. ............................. 339/17 CF; 339/150 B
[58] Field of Search ............. 339/17 R, 17 C, 17 CF, 339/147 R, 147 P, 154, 155, 166, 150 B, 151 B

[56] References Cited

U.S. PATENT DOCUMENTS

| | | | |
|---|---|---|---|
| 1,703,651 | 2/1929 | Alden | 339/155 T |
| 3,874,759 | 4/1975 | Colombo | 339/17 CF |
| 3,971,619 | 7/1976 | Rohrssen | 339/189 R |

Primary Examiner—Neil Abrams
Attorney, Agent, or Firm—Blakely, Sokoloff, Taylor & Zafman

[57] ABSTRACT

An interconnector for providing coupling between an integrated circuit pin connector, a socket connector which may be part of a printed circuit board, and a cable. Some pins of the pin connector connect directly with sockets of the socket connector, other pins and sockets are coupled to the cable. When used in an in-circuit emulator for a microcomputer, the interconnector permits the CPU or microprocessor to be physically located on the microcomputer's circuit board during testing of the microcomputer. Some of the signals which normally flow between the CPU or microprocessor and the remainder of the microcomputer are diverted to the cable. This permits sensing of signals intended for the CPU or microprocessor and the substitution of other signals in place of the sensed signals.

2 Claims, 6 Drawing Figures

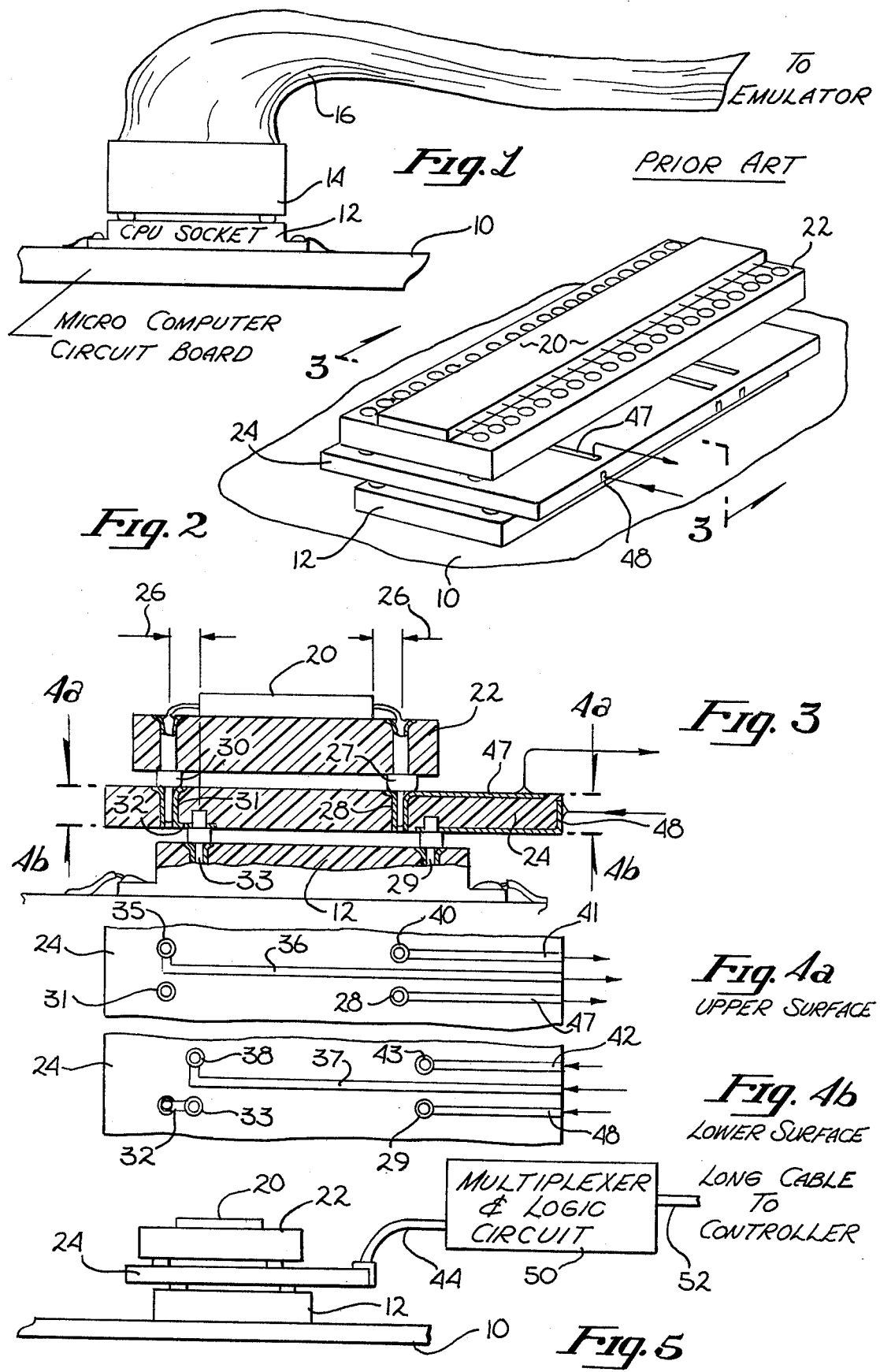

INTERCONNECTOR FOR INTEGRATED CIRCUIT PACKAGE

BACKGROUND OF THE INVENTION

1. Field of the Invention

The invention relates to the field of connectors, particularly connectors used for integrated circuit packages.

2. Prior Art

Recent advances in integrated circuit technology have made possible the extensive use of microcomputers. Most often these microcomputers include a microprocessor or central processing unit (CPU) which is coupled to other integrated circuits by printed circuits. For example, a CPU may be coupled to a clock generator, system controller, memories including PROMs, ROMs and RAMs, and peripheral units, such as a priority interrupt controller and bus driver. These microcomputers are often employed in specialized applications which require both unique hardware and software.

New test equipment and methods for microcomputers have been developed to permit "debugging" of both hardware and software. One such tool is the in-circuit emulator. These devices permit the simultaneous testing of both hardware and software. Most often the microprocessor or CPU is removed from its socket in the microcomputer. A connector then engages this socket and couples the microcomputer board to the emulator. A CPU or microprocessor identical to that used by the microcomputer is included within the emulator to permit emulation of microcomputer functions. Such emulators permit the interception of addresses, data, status information and other signals intended for the CPU or microprocessor, and the substitution or modification of these signals and the contents of memories and registers, in addition to other functions. These emulators often permit cycle-by-cycle operation of the microcomputer which greatly aids in isolating problems.

Emulators most often communicate with the microcomputer circuit board through a long umbilical cable which includes many leads (e.g. 40 leads). One such umbilical cable is shown schematically in *Electronics,* April 15, 1976 edition on page 117. In the centermost photograph on page 115 of this edition of *Electronics,* the cable and connector employed in one commercial emulator is shown. (This edition of *Electronics* describes numerous microcomputers and testing aids, including emulators.)

One problem with these emulators is that considerable time delay is introduced by the long umbilical cable. All the signals which flow between the CPU or microprocessor and the remainder of the microcomputer must pass through this cable. These time delays prevent real-time emulation, particularly for high performance microcomputers. In contrast, with the interconnector described in this application, the propagation delays associated with this emulator cable are substantially reduced. This enables better emulation and moreover, such emulation can be provided at a lower cost.

SUMMARY OF THE INVENTION

A connector apparatus is disclosed which provides coupling for an integrated circuit package, a circuit connector adaptable for receiving the package, and a cable. The apparatus includes a first connector means for receiving the integrated circuit package and a second connector means for engaging the circuit connector. A first plurality of lines are used to provide electrical paths between some contacts of the first and second connector means. A second plurality of lines provide electrical paths between other contacts of the first connector means and leads of the cable. A third plurality of lines provide electrical paths between other contacts of the second connector means and other leads of the cable. The first and second connector means and the first, second, and third plurality of lines form the apparatus such that when an integrated circuit package engages the first connector means it is in close proximity to the circuit connector. In this manner, some signals may be directly coupled between the circuit connector and the integrated circuit package, while other signals may be intercepted and replaced with signals from the cable.

BRIEF DESCRIPTION OF THE DRAWINGS

FIG. 1 is an illustration of the prior art structure used to couple a microcomputer circuit board with an emulator.

FIG. 2 is a perspective view of the interconnector of the present invention.

FIG. 3 is a cross-sectional elevation view of the interconnector of FIG. 2 taken through section line 3—3 of FIG. 2.

FIG. 4a is a partial plan view of the interconnector of FIGS. 2 and 3 taken through section line 4a—4a of FIG. 3.

FIG. 4b is a partial plan view of the interconnector of FIGS. 2 and 3 taken through section line 4b—4b of FIG. 3; and, FIG. 5 illustrates the interconnector of FIGS. 2, 3, 4a, and 4b when used as part of an in-circuit emulator for testing a microcomputer.

DETAILED DESCRIPTION OF THE INVENTION

An interconnector or interconnecting apparatus is described which is particularly suited for providing electrical coupling for an integrated circuit package, a connector which is part of a circuit board, and a cable. In the following description the interconnector shall be described in conjunction with an in-circuit emulator used for testing a microcomputer. It will be obvious to one skilled in the art that the interconnector may be employed in other applications.

Referring first to FIG. 1 a printed circuit board 10 is illustrated which board may include a plurality of socket connectors such as connector 12 and interconnecting lines. Each of the connectors such as connector 12, may be adaptable for receiving an integrated circuit package. Assume that the board 10 with its integrated circuit package forms a microcomputer. Assume further that the connector 12 receives a central processing unit (CPU) or a microprocessor for the microcomputer. In one common technique for testing the microcomputer, the CPU or microprocessor is removed from the connector 12 and coupled to an in-circuit emulator through a connector 14 and cable 16. In some cases, buffers are employed along the cable 16. The cable 16 is typically quite long to permit the in-circuit emulator to be conveniently placed along side the board 10.

The cable 16, most often, is coupled within the emulator to a CPU or microprocessor similar to that which is normally inserted within socket 12. The emulator includes numerous other circuits to duplicate functions of the system under test. As is apparent, signals between the CPU or microprocessor included within the emulator and the circuits of board 10 must flow through the long cable 16. Thus substantial time delays are caused by the cable 16. These delays limit the ability of the emulator to provide real-time emulation and causes other problems associated with the remotely located CPU or microprocessor.

In FIGS. 2, 3 and 5 the board 10 and circuit connector 12 are again illustrated. When the interconnector of the present invention is not employed, the pin connector 22 directly engages the socket connector 12. The pin connector 22, as shown, is part of an integrated circuit package which may include a CPU 20. For the described embodiment the sockets of connectors 12 and pins of connector 22 are in a dual in-line configuration.

Referring primarily to FIGS. 2 and 3, in its presently preferred embodiment, the interconnector is formed integrally with a circuit board 24. The upper surface of this board includes a socket connector for cooperatively receiving a pin connector such as pin connector 22. Thus the pin sockets in board 24 such as socket 31, are in a dual in-line configuration and have openings on the upper surface of board 24 which extend through the board 24. The lower surface of the board 24 includes an integral pin connector for cooperatively engaging the socket connector 12. Thus the pins of this connector are in dual in-line configuration and extend from the lower surface of the board 24. In its presently preferred embodiment, the lines of sockets which receive the pin connector 22 are offset from the pins which engage the socket 12. This offset is shown by dimension 26 of FIG. 3. This off-set is slightly larger than the diameter of a pin socket. Ordinary sockets and pins may be employed for fabricating the sockets and pins of the board 24.

Electrical paths or lines are provided with the board 24 such that some of the pins of connector 22 are directly connected with some of the sockets of the circuit connector 12. By way of example, referring particularly to FIG. 3 the pin 30 engages a socket 31 of the board 24. A line 32 which in the presently preferred embodiment is a printed circuit line, is formed on the lower surface of the board 24 (FIG. 4b) to couple the socket 31 with the pin 33. Thus, signals directed to the integrated circuit 20 on a line connected to the pin 33 are not significantly delayed since the circuit 20 is in close proximity with the socket 12.

Other pins of the connector 22 are not directly coupled to the socket 12. For example, referring again to FIG. 3, pin 27 engages a socket 28. This socket is not coupled to the pin 29 but rather is coupled to the line 47. This line is formed on the upper surface of the board 24 as is best illustrated in FIG. 4a. The pin 29 is coupled to a line 48, which line is formed on the lower surface of the board as is best illustrated in FIG. 4b. Referring again to FIG. 4a the socket 35 which receives a pin from the connector 22 is coupled to the line 36. This line is defined on the upper surface of the board 24 as is shown in FIG. 4a. Note the right angle in line 36, this allows the line 36 to pass between the sockets 28 and 40. The corresponding pin of board 24, pin 38 is coupled to a line 37 defined on the lower surface of the board 24 (FIG. 4b). Note the line 37 also includes a right angle to permit this line to pass between the pins 29 and 43. Similarly, the socket 40 shown in FIG. 4a is coupled to a line 41 and the corresponding pin 43 is coupled to a line 42 disposed on the lower surface of board 24.

The board 24 may be an ordinary printed circuit board used to define the various lines such as lines 36 and 37. Numerous well-known printed circuit boards including multi-layer circuit boards may be employed for board 24. The various lines on the board such as lines 36, 37, 41, 42, 47 and 48 (not lines 32, and like lines) are coupled to leads in a cable 44 shown in FIG. 5. These lines may be soldered, or otherwise bonded to the leads of this cable, or any one of a plurality of commercially available connectors may be employed to couple the cable 44 to these lines.

When the interconnector is employed as part of an in-circuit emulator for testing a microcomputer, the cable 44 is coupled to a multiplexer and logic circuit 50. This multiplexer and logic circuit includes a plurality of buffers and multiplexers which are controlled by a controller. As presently implemented the cable 44 is relatively short while the cable 52 which couples the multiplexer and logic unit 50 to the controller is relatively long.

Assume that the microcomputer formed on the board 10 is under test and that the interconnector is disposed between the connectors 12 and 22 as shown in FIG. 5. A plurality of the electrical paths between the CPU 20 and the socket are directly connected to one another, that is, they are not coupled to the cable 44. For example, the pin 30 of FIG. 3 is directly coupled through the line 32 to pin 33. Since the board 24 is relatively thin, no significant time delay occurs for these directly coupled signals. Thus, unlike the prior art apparatus described in conjunction with FIG. 1, where all the signals flow through the cable 16, with the disclosed interconnector some signals are directly coupled between the CPU 20 and the connector 12.

Assume that it is necessary for testing purposes to sense the signal provided by the CPU 20 to pin 27. This is accomplished by the multiplexer and logic circuit 50 which circuit couples line 47 through cables 44 and 52 to a controller. The controller may then sense the signal on this line and if necessary provide a different signal to pin 29 via line 48. If it is not necessary to interrupt the signal flow between lines 47 and 48, the multiplexer and logic circuit 50 provides a path between these lines. Note that cable 44 is relatively short, thus no significant delay is introduced when the signal between these lines flows to and from the multiplexer and logic circuit 50. This is in contrast to the prior art apparatus of FIG. 1 where the signal path included the long cable 16 even when a particular signal was not being intercepted.

The interconnector thus provides direct coupling for some signals and when used with a multiplexer provides a relatively short signal path for all other signals when the signals are not being intercepted. Only those signal paths which are being intercepted or substituted are coupled to the controller. The interconnector of the present invention substantially reduces the propagation delays associated with prior art emulators and permits better emulation, particularly for high performance microcomputers.

I claim:

1. A connector apparatus for providing coupling between a dual in-line integrated circuit package, a circuit connector adaptable for receiving said package, and a cable, comprising:

a cable having first and second leads;

a printed circuit board;

a first connector means on said board having a plurality of openings on the upper surface of said board for receiving said integrated circuit package, said first connector means having first and second contacts;

a second connector means including a plurality of pins extending from the lower surface of said board for engaging said circuit connector, said pins coupled to first and second contacts of said second connector means;

a first plurality of lines on said board for providing electrical paths between said first contacts of said first connector means and said first contacts of said second connector means;

a second plurality of lines on said board for providing electrical paths between said second contacts of said first connector means and said first leads of said cable;

a third plurality of lines on said board for providing electrical paths between said second contacts of said second connector means and said second leads of said cable;

said first, second and third plurality of lines being arranged in parallel relation to one another, at least some of said first, second and third plurality of lines being disposed on the underside of said board, the remaining lines being disposed on the upper side of said board, said first and second connector means and said first, second and third plurality of lines on said board for maintaining said integrated circuit package in close proximity to said circuit connector when said apparatus is disposed between said package and circuit connector;

whereby signals are directly coupled between said circuit connector and said integrated circuit package and whereby other signals are intercepted from the circuit connector and replaced with signals from said cable.

2. The apparatus defined in claim 1 wherein the lines associated with said openings of said first connector means are offset from the lines of said pins of said second connector means.

* * * * *